United States Patent [19]

Kobayashi

[11] Patent Number: 4,463,311
[45] Date of Patent: Jul. 31, 1984

[54] ELECTRONIC ELECTRIC-ENERGY METER

[75] Inventor: Shunichi Kobayashi, Tokyo, Japan

[73] Assignee: Tokyo Shibaura Denki Kabushiki Kaisha, Japan

[21] Appl. No.: 267,604

[22] Filed: May 27, 1981

[30] Foreign Application Priority Data

May 29, 1980 [JP] Japan .................................. 55-71723
Jun. 6, 1980 [JP] Japan .................................. 55-76387
Jul. 25, 1980 [JP] Japan .......................... 55-105228[U]

[51] Int. Cl.³ ............................................ G01R 21/06
[52] U.S. Cl. .................................. 324/142; 328/160; 364/483; 364/842
[58] Field of Search ................. 324/142, 111; 328/160; 364/483, 842

[56] References Cited

U.S. PATENT DOCUMENTS 4,217,545 8/1980 Kusui et al. ......................... 324/142
4,408,283 10/1983 Kovalchik ............................ 324/142

FOREIGN PATENT DOCUMENTS 5013081 6/1973 Japan .
50-13037 3/1974 Japan .
50-133872 4/1974 Japan .
50-71267 9/1974 Japan .

Primary Examiner—Ernest F. Karlsen
Attorney, Agent, or Firm—Finnegan, Henderson, Farabow, Garrett & Dunner

[57] ABSTRACT

An electronic electric-energy meter comprises a delay time setting circuit connected to one of a voltage transformer and a current transformer connected to power lines for providing a necessary delay time and a delay circuit for which a delay time is set by the delay time setting circuit, the delay circuit delaying a pulse width duty cycle signal corresponding to a voltage applied from the voltage transformer. The pulse width duty cycle signal is formed by a pulse width modulation circuit connected to the voltage transformer. In the delay circuit connected to the pulse width modulation circuit, the duty cycle signal is delayed by the delay time set by the delay time setting circuit. In a time division multiplying circuit connected to the delay circuit, the delayed signal is multiplied by a current signal from the current transformer, thereby forming a signal proportional to electric power. The electric power signal is integrated by an integration circuit connected to the time division multiplying circuit, whereby a signal proportional to electric energy is obtained. The electric energy signal is converted into a display signal in a processing circuit connected to the integration circuit. On the basis of the display signal, a display circuit connected to the processing circuit displays the electric energy measured.

8 Claims, 21 Drawing Figures

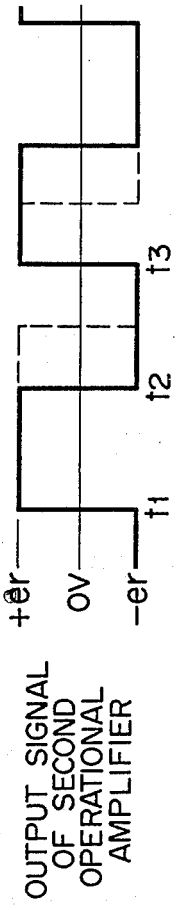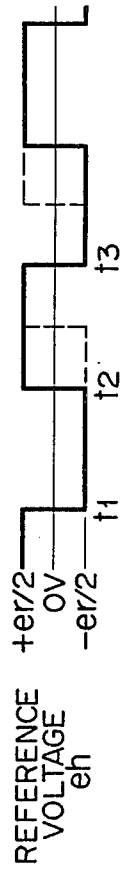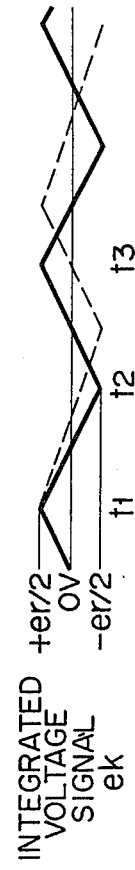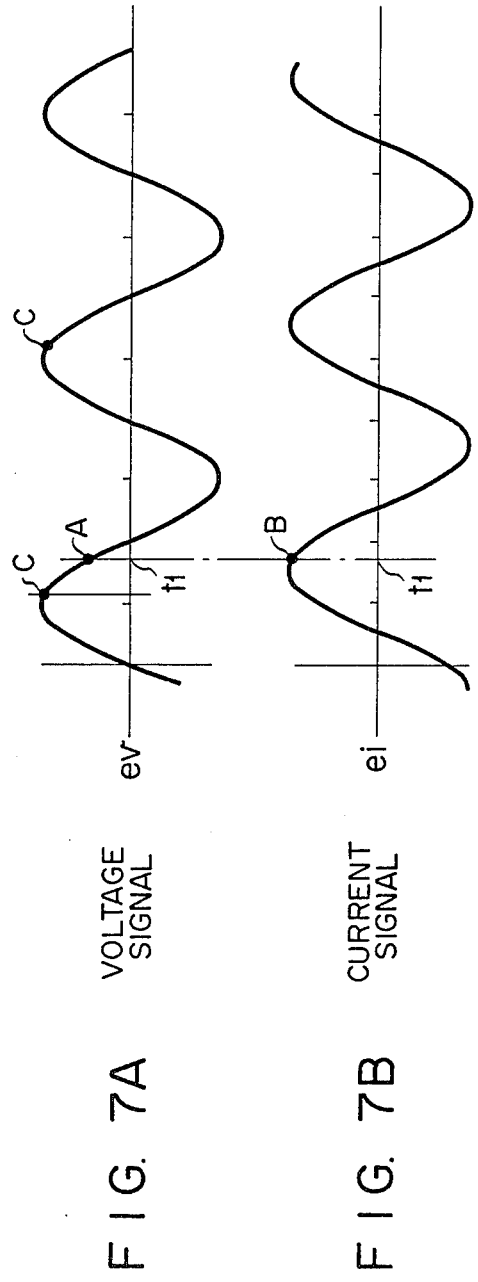
FIG. 6A OUTPUT SIGNAL OF SECOND OPERATIONAL AMPLIFIER
FIG. 6B REFERENCE VOLTAGE eh
FIG. 6C INTEGRATED VOLTAGE SIGNAL ek
FIG. 7A VOLTAGE SIGNAL
FIG. 7B CURRENT SIGNAL

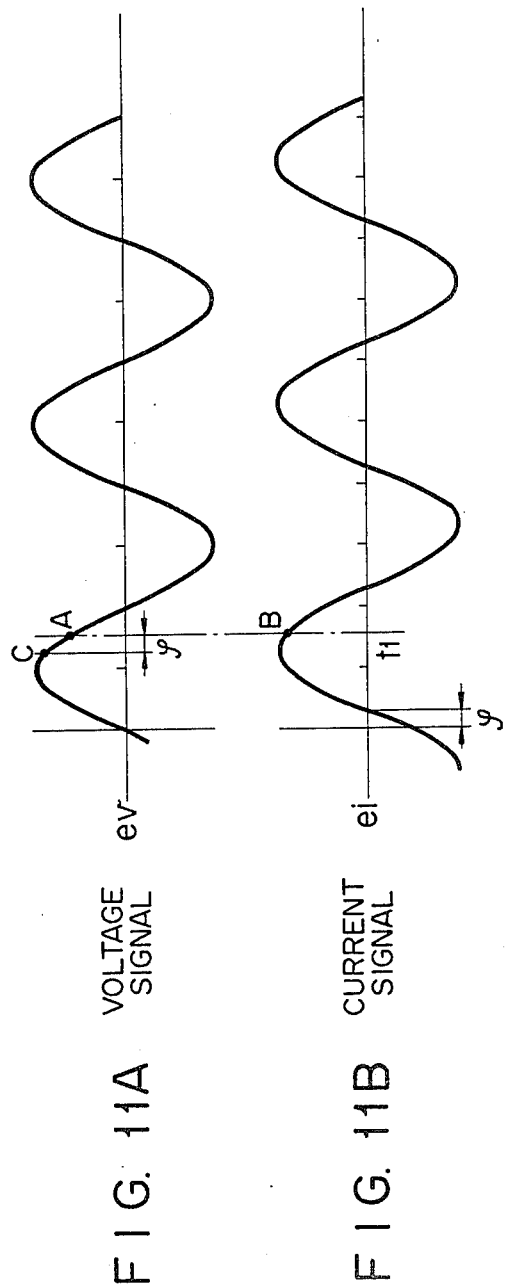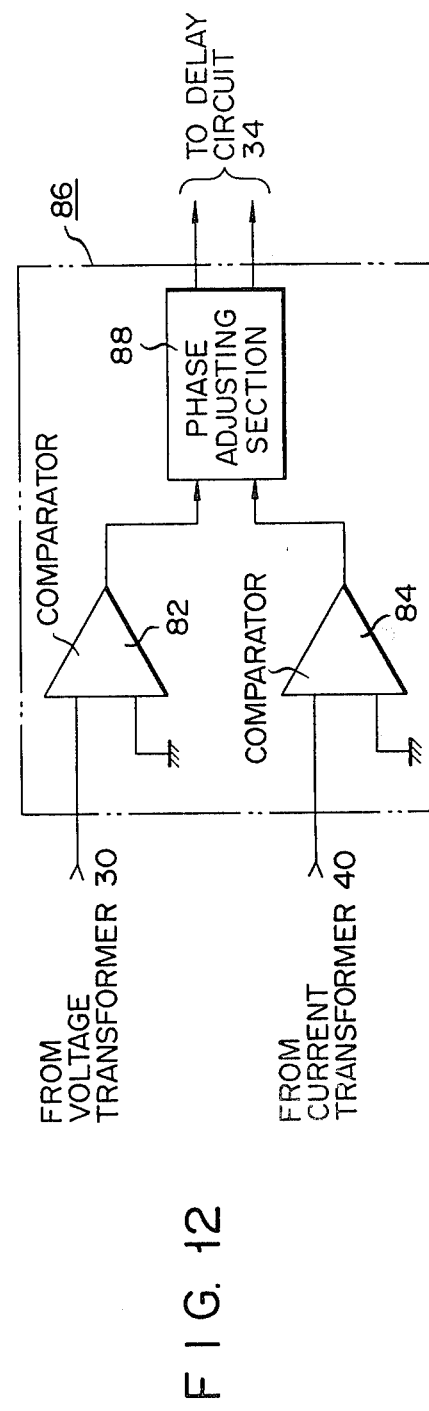

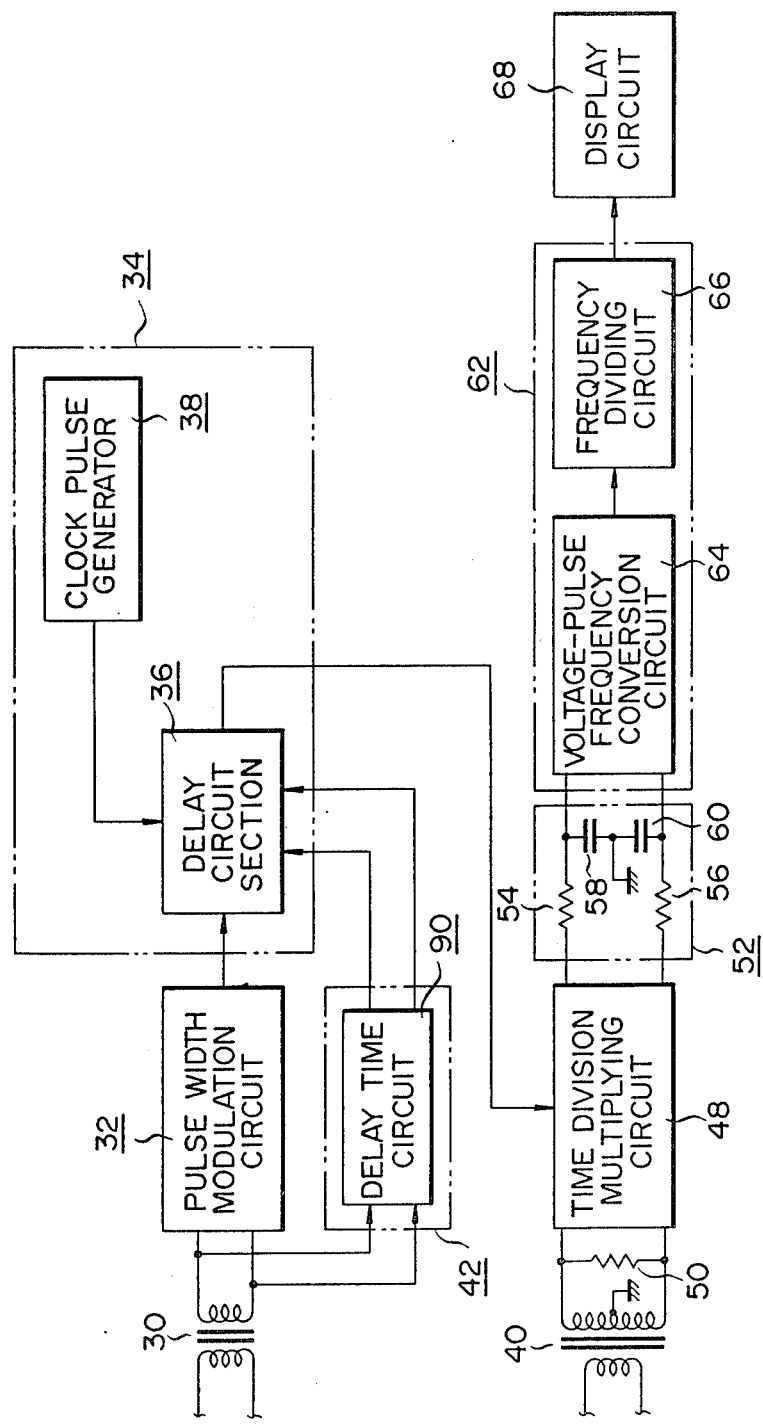

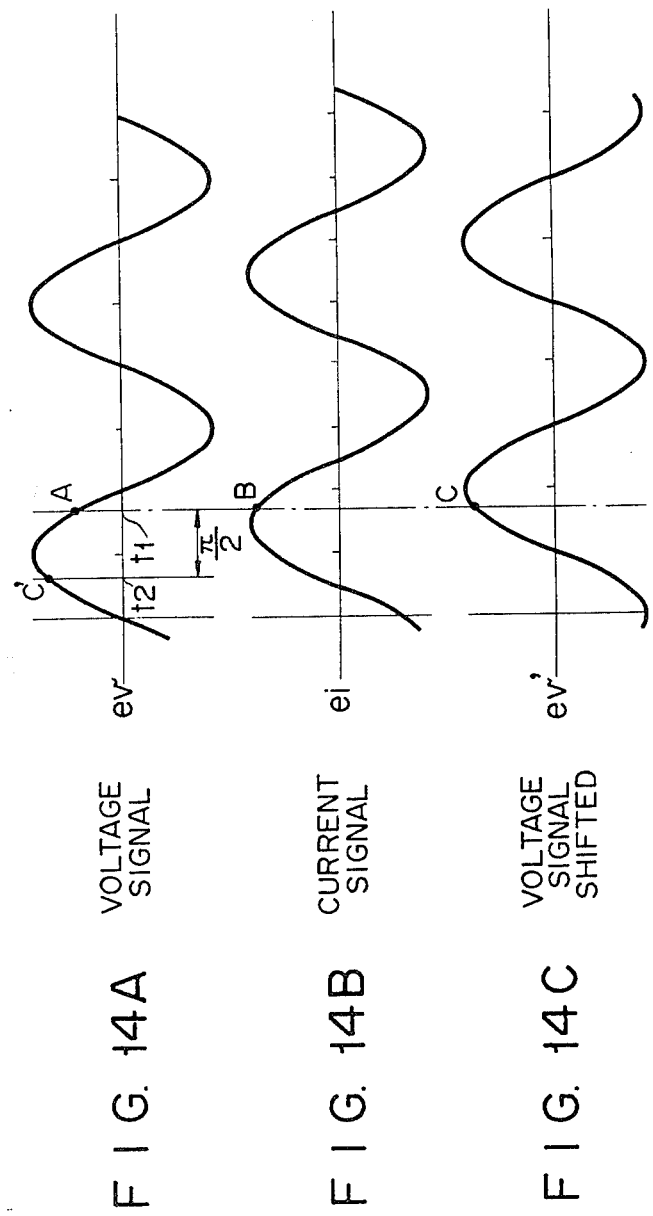

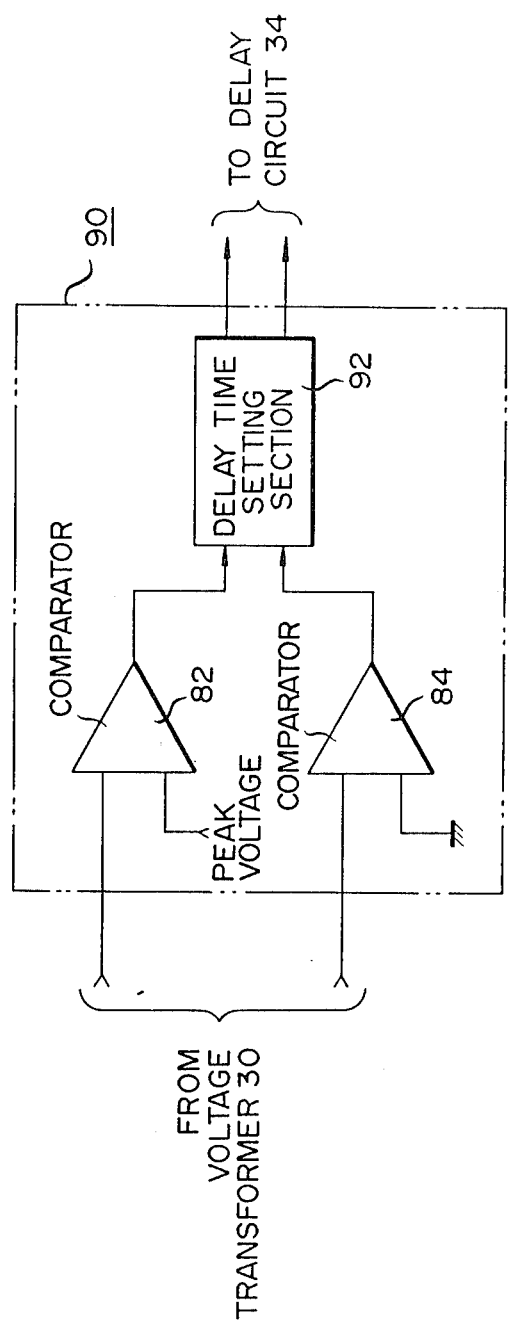
F I G. 15

ELECTRONIC ELECTRIC-ENERGY METER

The present invention relates to an electronic electric-energy meter and, more particularly, to an electronic electric-energy meter with a simple arrangement which can measure electric energy with a high accuracy.

Conventionally, apparent electric energy has been measured by either of the following two methods. In one method, the apparent electric energy is obtained by first calculating apparent power as $=\sqrt{P^2+Q^2}$, based on a signal representing effective power P obtained by an effective power meter and a signal representing a reactive power Q obtained by a reactive power meter, and then multiplying the obtained apparent power by a time component. In the other method, the apparent electric energy is measured by using an apparent electric-energy meter with a construction shown in FIG. 1. In the figure, a voltage transformer 10 for a meter is connected to a power line to produce a voltage signal in proportion to a load voltage. A current transformer 12 is connected with the power line to produce a current signal proportional to a load current. The voltage signal is converted into a d.c. signal by a rectifying circuit 14, while the current signal is converted to a d.c. signal by another rectifying circuit 16. Both the d.c. signals are multiplied in a multiplying circuit 18, and then integrated in an integration circuit 20. As a result, a signal proportional to the apparent electric energy is obtained. Further, the signal obtained is processed properly in a processing circuit (not shown) to drive a display section to display the apparent electric energy in a display section, for example.

The former method, however, is disadvantageous in requiring both an effective electric-energy meter and an reactive electric-energy meter, causing the size of the measuring device to be large. The latter method can not measure the apparent electric energy with a high accuracy, because the apparent electric-energy meter is greatly influenced by characteristics of the rectifying circuits, such as the characteristics of diodes constituting the rectifying circuits.

Effective electric energy is measured using an effective electric-energy meter having an arrangement shown in FIG. 2. One difference between the construction of the effective electric-energy meter of FIG. 2 and that of the apparent electric-energy meter of FIG. 1 is that the rectifying circuits 14 and 16 of FIG. 1 have been replaced respectively by compensating circuits 22 and 24. When the load voltage is converted into a voltage signal proportional to the load voltage by the voltage transformer 10, and the load current is converted into a current signal by the current transformer 12, the voltage and current signals are phase-shifted. As a result, there are produced errors in the phase angles of the voltage and current signals. To compensate for the errors, the compensating circuits 22 and 24 are provided. The signals from the voltage transformer 19 and the current transformer 12 are respectively compensated by the compensating circuits 22 and 24 and applied to the multiplying circuit 18. Then, in the same manner as mentioned above, the signals are processed and the effective electric energy is visually displayed.

Since the compensating circuits 22 and 24 include capacitors, resistors and the like, their phase angle compensating characteristics fluctuate with frequency. Therefore, the characteristics of the effective electric-energy meter also depends largely on the frequency, making it impossible for the effective electric energy to be measured with a high accuracy.

Reactive electric energy is measured using a reactive electric-energy meter constructed as shown in FIG. 3. One difference between the construction of the reactive electric-energy meter of FIG. 3 and that of the effective electric-energy meter of FIG. 1 is that the rectifying circuits 14 and 16 of FIG. 1 have been replaced respectively by the phase shifting circuits 26 and 28.

Assuming that the load voltage is V, load current is I, and a power factor angle is $\theta$, reactive power PA is expressed by the following equation.

$$PA = VI \sin\theta \qquad (1)$$

The effective power PE is given by $$PE = VI \cos\theta \qquad (2)$$

If the power factor angle $\theta$ is delayed by $\pi/2$, the equation (2) can be rewritten as:

$$PE = VI \cos(\theta - \pi/2) \qquad (3)$$

Since $$\cos(\theta - \pi/2) = \sin\theta \qquad (4)$$

the equation (3) is equal to the equation (1). Therefore, the reactive power may be obtained by multiplying the load voltage by the load current which has been phase-shifted by $\pi/2$. The reactive electric-energy meter shown in FIG. 3 is based on this principle.

The signals from the voltage transformer 10 and from the current transformer 12 respectively are phase-shifted by the phase shifting circuits 26 and 28, so that the phase is further shifted by $\pi/2$ from the power factor angle $\theta$. The signals from the phase shifting circuits 26 and 28 are applied to the multiplying circuit 18. Then, the signal from the multiplying circuit 18 is in the same manner; and as mentioned above and the reactive power is visually displayed.

Since the phase shifting circuits 26 and 28 are made up of inductors or capacitors, their phase shifting characteristics fluctuate with frequency. Therefore, the characteristic of the reactive electric-energy meter also depends largely upon frequency, with the result that a highly accurate measurement of the reactive power is impossible.

Accordingly, the object of the present invention is to provide an electronic electric-energy meter of small size which can measure electric energy with high accuracy.

This object has been attained by an electronic electric-energy meter which comprises: a voltage transformer connected to power lines for producing an electrical voltage signal proportional to a load voltage on the power lines; a current transformer connected to the power lines for producing an electrical current signal proportional to a load current on the power lines; a pulse width modulation circuit connected to one of voltage transformer or the current transformer for forming a pulse width duty cycle signal by performing a pulse width modulation based on a corresponding one of the electrical signals; a delay circuit connected to the pulse width modulation circuit for producing a delayed pulse duty cycle signal delaying the pulse duty cycle signal by a specified time in accordance with the kind of electric energy to be measured; a delay time setting circuit connected to the delay circuit and to at least one of the voltage transformer and the current transformer for setting a delay time in the delay circuit; a time division multiplying circuit connected to the pulse width modulation circuit and to one of the voltage transformer or the current transformer, which inputs the other one of electrical signals on the basis of the pulse width duty cycle signal and multiplies both the other one of the electrical signals and the delayed pulse duty cycle signal to obtain an electric power signal proportionl to electric power; an integrating circuit connected to the time division multiplying circuit for producing an electric energy signal proportional to electric energy by integrating the electric power signal; a processing circuit connected to the integrating circuit for converting the electric energy signal to a display signal; and a display circuit connected to the processing circuit for displaying electric energy in accordance with the display signal.

As described above, the electronic electric-energy meter according to the present invention can measure apparent, effective, and reactive electric energy respectively by merely changing the delay time of the delay circuit. Since the electronic electric-energy meter, unlike known meters, does not need rectifying circuits, a compensating circuit, or a phase shifting circuit, the frequency characteristic and the response characteristic of the electric-energy meter of the invention are free from the adverse influence of those circuits. Additionally, since the delay time setting circuit digitally processes the signal, its frequency and response characteristics are stable. As a consequence, the electric-energy meter of the invention features small size and highly accurate measurement of the electric energy.

By way of example and to make the description clearer, reference is made to the accompanying drawings, in which:

FIGS. 6A to 6C are waveforms illustrating the operation of the pulse width modulation circuit shown in FIG. 5;

FIGS. 7A and 7B are waveforms illustrating the principle of the first embodiment of the invention shown in FIG. 1;

FIGS. 11A and 11B are waveforms illustrating the principle of the second embodiment of the invention shown in FIG. 10;

FIG. 12 is a block schematic diagram of an arrangement of the time setting circuit shown in FIG. 10;

FIG. 13 is a block and circuit schematic diagram of a third embodiment of an electronic electric-energy meter resulting when the teaching of the present invention is applied to a reactive electric-energy meter;

FIGS. 14A to 14C are waveforms illustrating the principle of the third embodiment of the invention shown in FIG. 13; and FIG. 15 is a block schematic diagram of an arrangement of the delay time setting circuit shown in FIG. 13.

Figure 1:
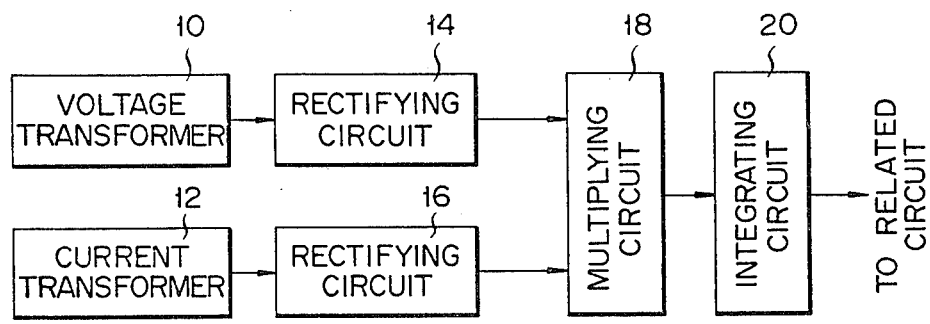
FIG. 1 is a block diagram of a known electronic apparent electric-energy meter.
Figure 2:
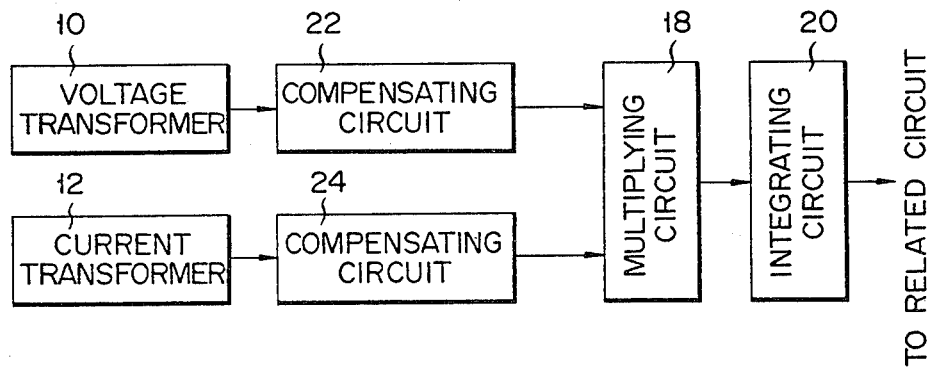
FIG. 2 is a block diagram of a known electronic effective electric-energy meter.
Figure 3:
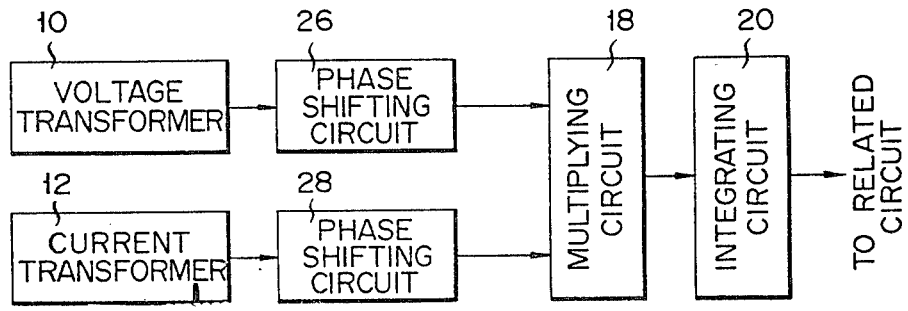
FIG. 3 is a block diagram of a known reactive electric-energy meter.
Figure 4:
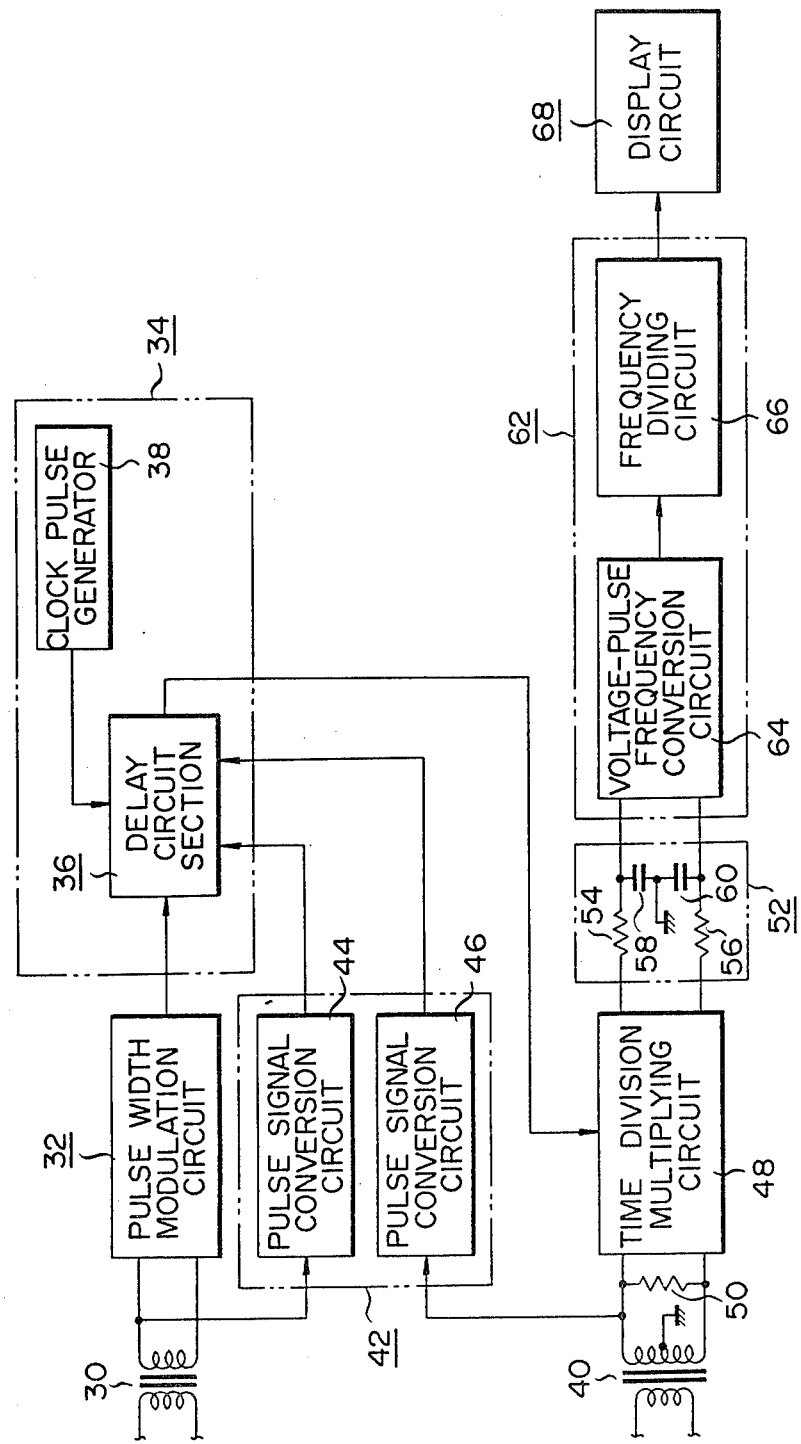
FIG. 4 is a block and circuit schematic diagram of a first embodiment of an electronic electric-energy meter resulting when the teaching of the present invention is applied to an apparent electric-energy meter.

FIG. 4 schematically illustrates an arrangement of a first embodiment of an electronic electric-energy meter resulting when the teaching of the present invention is applied to an electronic apparent electric-energy meter.

A voltage transformer 30 for a meter connected to power line (not shown) produces a voltage signal $e_v$ proportional to a load voltage.

A pulse width modulation circuit 32 connected to the transformer 30 performs a pulse width modulation based on the voltage signal $e_v$ from the transformer 30, thereby producing a pulse width duty cycle signal.

A delay circuit 34 is comprised of a delay circuit section 36 connected to the outputs of pulse width modulation curcuit 32 and a clock pulse generator 38 for producing clock pulse signals. The delay circuit section 36, comprised of, for example, a multi-stage random shift register, delays the input pulse width duty cycle signal from pulse width modulation circuit 32 by a period of time corresponding to the phase difference between load voltage and the load current on the power lines in the present embodiment to produce a delayed pulse width duty cycle signal.

A transformer 40 also connected to the power lines produces a current signal $e_i$ in proportion to the load current.

A delay time setting circuit 42 is comprised of a first pulse signal conversion circuit 44, a first input terminal of which is connected to the voltage transformer 30, and a second pulse signal conversion circuit 46 connected at the input terminal thereof to the current transformer 40. The conversion circuits 44 and 46 are made up of comparators, for example, and detect time points at which the electrical signals inputted thereto cross a zero level, thereby to produce together a pair of output electrical signals indicative of the phase difference between the electrical signals inputted. The output terminals of the conversion circuits 44 and 46 are coupled with the delay circuit section 36.

A time division multiplying circuit 48 connected to the current transformer 40 and the output of delay circuit section 36 is comprised of a set of analog switches, for example. The time division multiplying circuit 48 selectively controls the analog switches according to the delayed pulse width duty cycle signal delivered from the delay circuit section 36, thereby to process an input voltage signal proportional to the current signal $e_i$ being delivered across a resistor 50, by first performing a time division multiplication of the input voltage signal by the pulse width duty cycle signal from the delay circuit section 36, and then forming an output signal proportional to the electric power on the power lines.

The integration circuit 52 connected to the time division multiplying circuit 48 integrates the power signal therefrom to produce a voltage signal proportional to the electric energy. The integration circuit 52 is comprised of series circuits including resistors 54 and 56 and capacitors 58 and 60 connected as shown.

A processing circuit 62 connected to the integration circuit 52 converts the electric energy signal therefrom into a display signal. The processing circuit 62 is comprised of a voltage-pulse frequency conversion circuit 64 connected to the integration circuit 52 and a frequency dividing circuit 66 connected to the output of conversion circuit 64. The voltage-pulse frequency conversion circuit 64 produces a pulse signal with a frequency proportional to the level of the voltage signal transmitted from the integration circuit 52. The frequency dividing circuit 66 frequency-divides the pulse signal transferred from the voltage-pulse frequency conversion circuit 64, thereby producing a display signal.

A display circuit 68 connected to the processing circuit 62 visually displays the electric energy in accordance with the display signal transferred from the frequency dividing circuit 66.

Figure 5:
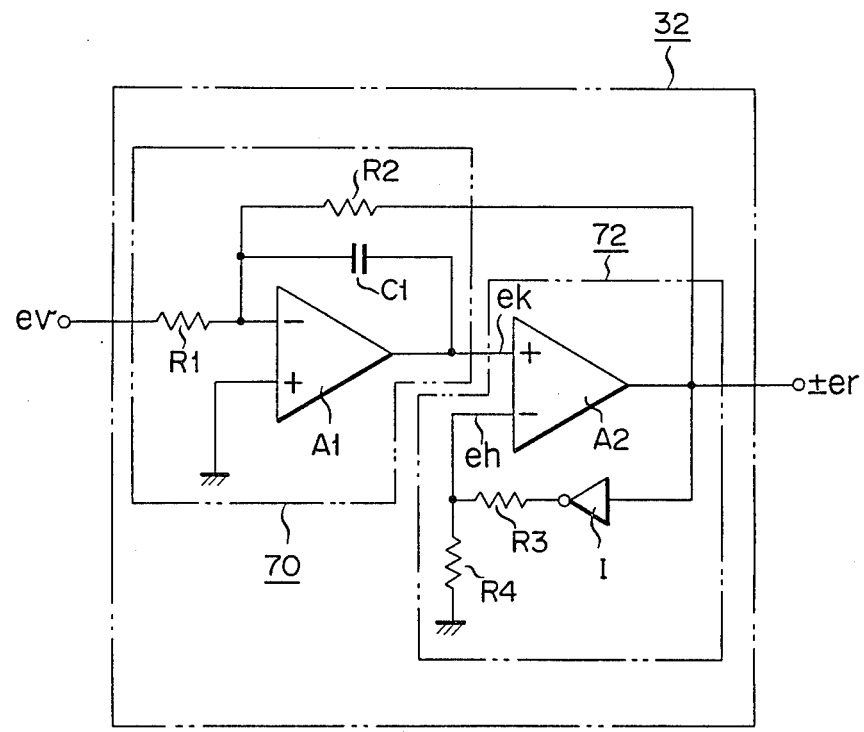
FIG. 5 is a circuit diagram of a pulse width modulation circuit such as that shown in FIG. 4.

FIG. 5 shows a circuit diagram of the pulse width modulation circuit 32 shown in FIG. 4. The pulse width modulation circuit 32 comprises an integration circuit 70 connected to the voltage transformer 30 and a comparing circuit 72 coupled with the integration circuit 70. The integration circuit 70 includes a resistor R1, a first operational amplifier A1 connected at the inverting input terminal thereof to the transformer 30 through the resistor R1 and at the noninverting input terminal thereof to ground, a capacitior C1 connected between the inverting input terminal and the output terminal of the operational amplifier A1, and a resistor R2 connected between the inverting input terminal of the operational amplifier A1 and the output terminal of the comparing circuit 72. The comparing circuit 72 is comprised of a second operational amplifier A2 connected at the noninverting input terminal thereof to the output terminal of the first operational amplifier A1 for receiving an integrated voltage signal $e_k$ therefrom, an inverter I connected to the output terminal of the second operational amplifier A2 for inverting the output signal of the amplifier A2, and a pair of resistors R3 and R4 commonly connected to the inverting input terminal of second operational amplifier A2 and individually connected respectively to the output terminal of the inverter I and to ground for voltage-dividing the output of the inverter and supplying a comparing reference voltage $e_h$ to the inverting input terminal of the second operational amplifier A2. The comparing circuit 72 is so designed as to produce a voltage $(+e_r)$ when its logical output is "1" and a voltage $(-e_r)$ when its logical output is "0".

In the pulse width modulation circuit 32 thus constructed, it is assumed that the logical output of the comparing circuit 72 is logical "1" when the voltage signal $e_v$ is at zero level ($e_v = 0$), and that the voltage dividing resistors R3 and R4 are equal to each other in value.

In this case, the second operational amplifier A2 produces at the output terminal the voltage $(+e_r)$ at time t1, as shown in FIG. 6A. Since the voltage $+e_r$ is inverted by the inverter I and then divided into $\frac{1}{2}e_r$ by the combination of the resistors R3 and R4, a voltage $(-e_r/2)$ as the reference voltage $e_h$ is applied to the inverting input terminal of the operational amplifier A2 at time t1, as shown in FIG. 6B. While, since the voltage $(+e_r)$ is supplied to the noninverting input terminal of the first operational amplifier A1 by way of the resistor R2, the integrated voltage signal $e_k$ from the amplifier A1 has a negative slope from time t1, as shown in FIG. 6C. When, the integrated voltage signal $e_k$ drops up to $(-e_r/2)$ and satisfies $e_k \leq e_h$ (time t2 in FIG. 6C) the logical output of the second operational amplifier A2 is inverted to logical "0" to produce the voltage $(-e_r)$ (time t2 in FIG. 6A). Then, the $(+e_r/2)$ is applied as the comparing reference voltage $e_h$ to the inverting input terminal of the second amplifier A2 (time t2 in FIG. 6B). Simultaneously, the voltage $(-e_r)$ is applied to the inverting input terminal of the first operational amplifier A1, through the resistor R2, so that the integrated voltage signal $e_k$ of the amplifier A1 has a positive slope from time t2, as shown in FIG. 6C. Then, when the integrated voltage signal $e_k$ reaches $(+e_r/2)$ and satisfies $e_k \geq e_h$ (time t3 shown in FIG. 6C), the logical output of the second operational amplifier A2 is inverted into logical "1" to produce the voltage $(+e_r)$ (time t3 shown in FIG. 6A). In this way, the pulse width modulation circuit 32 repeats the sequence of the operational steps to continue a self-oscillation.

A pulse width duty cycle of the pulse width modulation circuit 32 operating as mentioned above may be mathematically expressed in the following. Assuming that $t_a$ is the time interval during which the output of the second operational amplifier A2 is logical "1" and $t_b$ is the time interval during which it is logical "0", the integrated voltage signal $e_k(t_a)$ is $$e_k(t_a) = -\left( \frac{1}{R1C1} \int_0^{t_a} e_v dt + \frac{1}{R2C1} \int_0^{t_a} e_r dt \right) \tag{5}$$

$$= -e_r$$

where R1 and R2, and C1 are resistance and capacitance of the thereby designated resistors and the capacitor shown in FIG. 5.

If $R1 = R2$, $t_a$ is expressed by $$t_a = \frac{e_r R1 C1}{e_r + e_v} \tag{6}$$

The integrated voltage signal $e_k(t_b)$ is given $$e_k(t_b) = -\left( \frac{1}{R1C1} \int_0^{t_b} e_v dt + \frac{1}{R2C1} \int_0^{t_b} e_r dt \right) \tag{7}$$

$$= +e_r$$

If $R1 = R2$, $t_b$ is $$t_b = \frac{e_r R1 C1}{e_r - e_v} \tag{8}$$

Thus, the pulse width duty cycles D and $\overline{D}$ may be calculated by using the equations (6) and (8), $$D = \frac{t_a}{t_a + t_b} = \frac{e_r - e_v}{2e_r} \tag{9}$$

$$\overline{D} = \frac{t_b}{t_a + t_b} = \frac{e_r - e_v}{2e_r} \tag{10}$$

FIGS. 7A and 7B show waveforms for illustrating a general multiplying method for obtaining the effective power and the reactive power. The effective power is the product of the voltage signal $e_v$ and the current signal $e_i$. From a simultaneous view point, at time t1 effective power is the product of the signals at points A and B in the figures. The reactive power is obtained by multiplying the current signal $e_i$ by a voltage signal which is formed by phase shifting voltage signal $e_v$ with respect to the current signal $e_i$ by the phase difference between the voltage and current signals $e_v$ and $e_i$ respectively. In the first embodiment under discussion, the phase difference is detected by the delay time setting circuit 42, the voltage signal is equivalently delayed by the delay circuit 36, and the voltage and current signals at the points A and B are multiplied by the time division multiplying circuit 4B at time t1 to obtain the reactive power.

Figure 8:
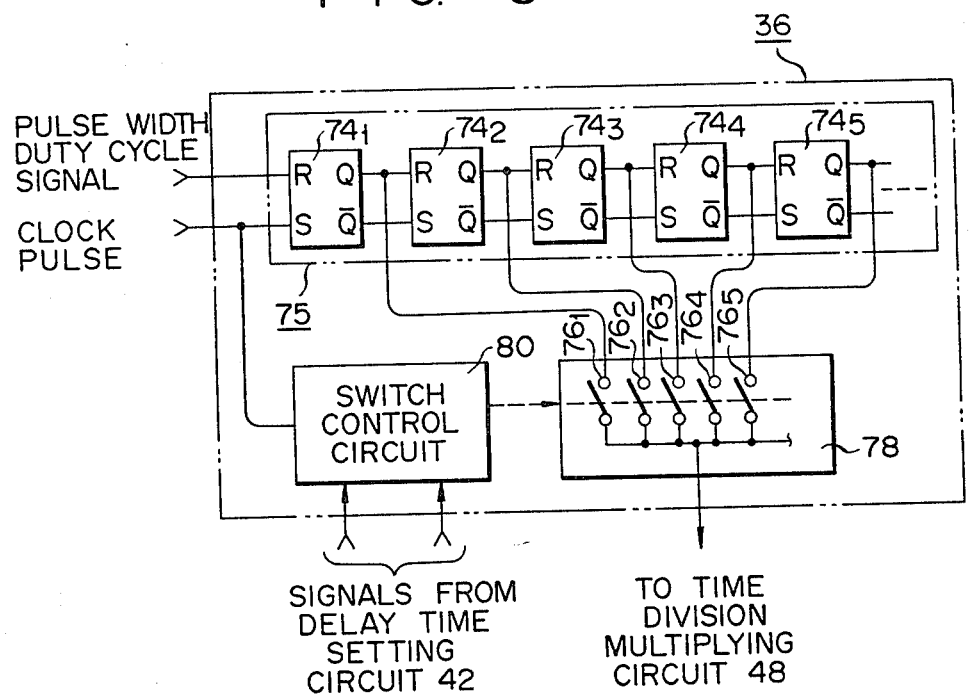
FIG. 8 is a block and circuit schematic diagram of a delay circuit section such as that shown in FIG. 4.

FIG. 8 shows a circuit schematic diagram of the delay circuit section 36 shown in FIG. 4. The delay circuit section 36 comprises a random shift register 75 including a plurality of reset flip-flop circuits $74_1$ to $74_n$ connected in series, a switch circuit 78 containing switches $76_1$ to $76_n$ respectively connected to the Q output terminals of the flip-flops $74_1$ to $74_n$, and a switch control circuit 80 electrically connected to the switch circuit 78. In response to the two pulse signals inputted thereto from the delay time setting circuit 42 and the clock pulse signal from the clock pulse generator 38 the switch control circuit 80 closes one of the switches $76_1$ to $76_n$ for providing a delay proportional to the time difference between the two pulse signals from delay time setting circuit 42.

Figure 9:
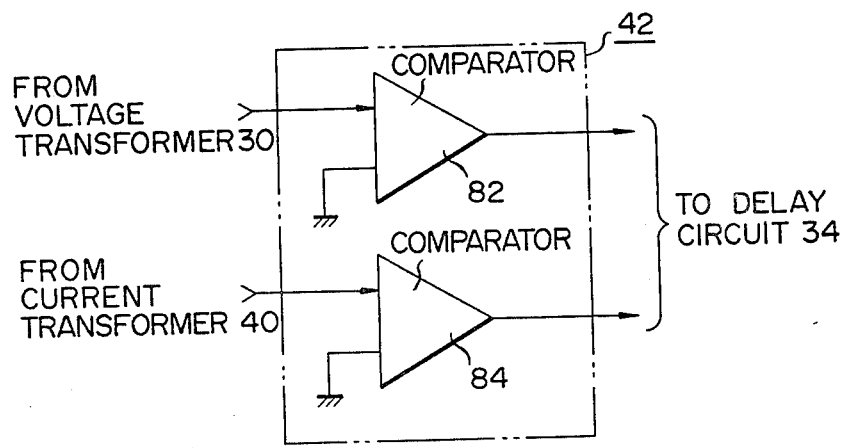
FIG. 9 is a block schematic diagram of a delay time setting circuit such as that shown in FIG. 4.

FIG. 9 schematically illustrates in block form a configuration of the delay time setting circuit 42 shown in FIG. 4. The delay time setting circuit 42 comprises a first comparator 82 connected to the voltage transformer 30 and a second comparator 84 connected to the current transformer 40. Since the reference voltage terminals of the first and second comparators 82 and 84 are both kept at zero level, those comparators respectively detect time points at which the voltage signal from the voltage transformer and the current signal from the current transformer cross the zero level, and transfer the detected signals in the form of pulse signals to the delay circuit 36 to set a delay time therein.

The operation of the first embodiment with such a construction will be described. The load voltage from the power lines is converted by the voltage transformer 30 into a voltage signal proportional to the load voltage and is then applied to the pulse width modulation circuit 32. The pulse width modulation circuit 32 produces a pulse width duty cycle signal in accordance with the voltage signal and transfers it to the delay circuit 34. The pulse width duty cycle signal is delayed by a time set by the delay time setting circuit 42. More specifically, the pulse width duty cycle signal is shifted in the random shift register 75 during a time interval from the leading edge of the pulse synchronized with the voltage signal $e_v$ to the leading edge of the pulse synchronized with the current signal $e_i$. The delayed width duty cycle signal is in turn introduced into the time division multiplying circuit 48, where it is multiplied by the voltage signal proportional to the current signal from the current transformer 40. Therefore, the voltage signal $e_v$ and the current signal $e_i$ are multiplied in phase, so that an electrical signal proportional to the apparent power is obtained. The apparent power signal is integrated, by the integration circuit 52, into a voltage signal proportional to the electric energy. The electric energy signal, after being converted into a display signal by the processing circuit 62, is transferred to the display circuit 68, where the electric energy is visually displayed.

As described above, the first embodiment has the delay circuit 34 between the pulse width modulation circuit 32 and the time division multiplication circuit 48. The pulse width duty cycle signal is sequentially applied to the delay circuit 34 in synchronism with the clock pulse. The delay time setting circuit 42 detects the zero-cross points of the voltage signals proportional to the load voltage and to the load current. Then, the pulse width duty cycle signal is held by the delay circuit section 36 for the time interval corresponding to the phase difference between the voltage and current circuits. The delayed pulse width duty cycle signal is subjected to time division multiplication in the time division mulitiplication circuit 48, producing a signal corresponding to the apparent power. With the arrangement of the embodiment as mentioned above, a highly accurate apparent electric energy measurement can be attained without the need for any complicated construction.

Figure 10:
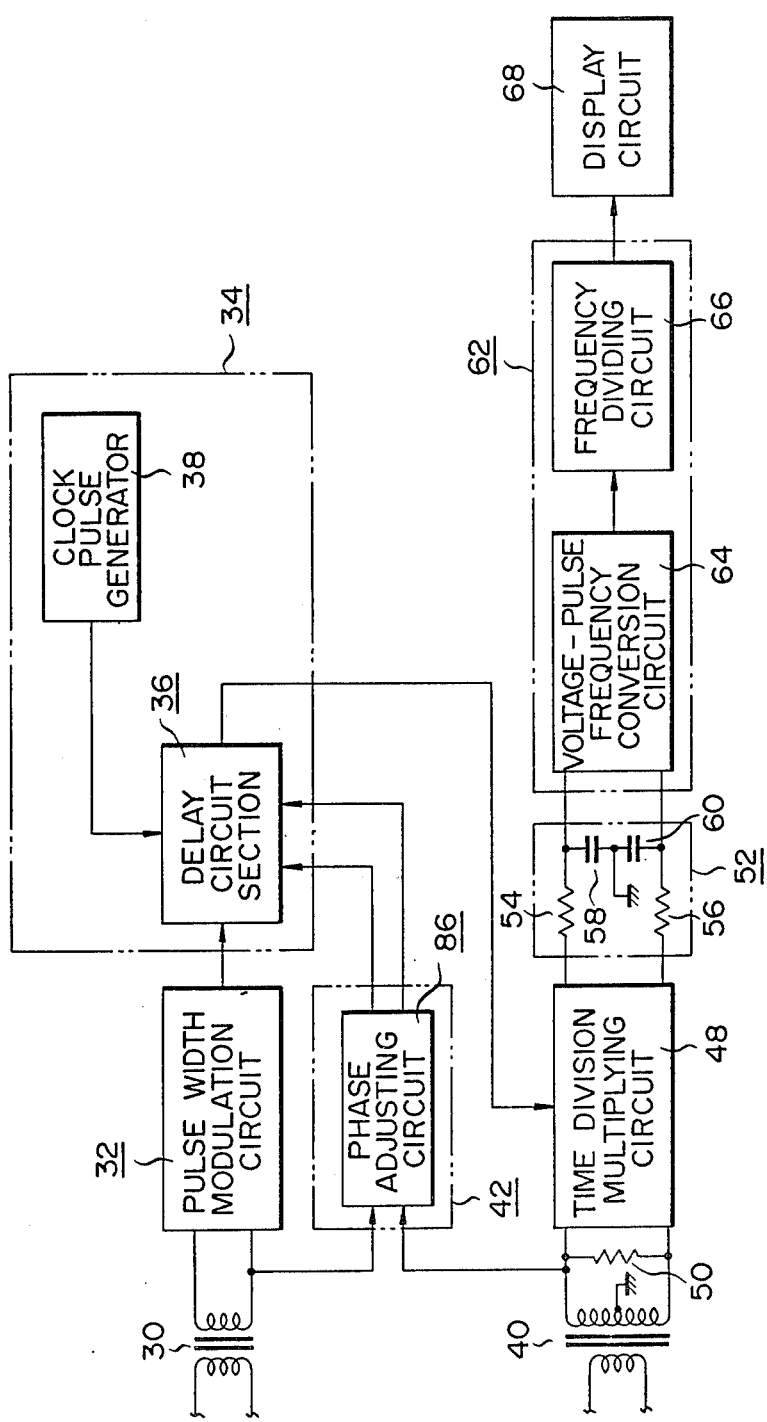
FIG. 10 is a block and circuit schematic diagram of a second embodiment of an electronic electric-energy meter resulting when the teaching of the present invention is applied to an effective electric-energy meter.

Turning now to FIG. 10, there is shown a block schematic diagram of a second embodiment of an electronic electric-energy meter resulting when the teaching of the present invention is applied to an effective electric-energy meter. In the figure, like symbols are used to designate like portions or equivalent portions in the construction of the apparent electric-energy meter shown in FIG. 4, and no further explanation of their operations will be given.

A difference between the effective electric-energy meter shown in FIG. 10 and the apparent electric-energy meter of the first embodiment of FIG. 4 resides in the construction of the delay time setting circuit 42. The effective electric-energy meter can be obtained by changing the delay time set in the delay circuit 34 as described below.

Before proceeding with the detailed description of the second embodiment, assume that the load voltage and the load current on the power lines have power factor 1 and are converted into the voltage signal $e_v$ and the current signal $e_i$ by the voltage transformer 30 and the current transformer 40, respectively, and a phase angle difference $\phi$ is produced between these signals $e_v$ and $e_i$ through the conversions, as shown in FIGS. 11A and 11B. In this case, for example, an instantaneous effective power at time t1 is the product of the signals at points A and B. As a result, the resulting instaneous effective power is different from a correct instantaneous effective power, which is the product of the signals at points B and C, resulting in an erroneous effective power. In the second embodiment, however, the correct effective power is obtained by compensating for the phase angle difference $\phi$ between the voltage $e_v$ and the current signal $e_i$.

The delay time setting circuit 42 comprises a phase adjusting circuit 86. FIG. 12 schematically illustrates a circuit arrangement of the phase adjusting circuit 86. In the figure, like symbols are used for designating like or equivalent portions in FIG. 9 and no further explanation of them will be described. The output terminals of the first and second comparators 82 and 84 are connected to input terminals of a phase adjusting section 88. The phase adjusting section 88 obtains the phase difference caused by the voltage transformer 30 and the current transformer 40 by using the pulse signals transmitted from the first and second comparators 82 and 84 and transmits pulse signals cooperatively representing the error. To be more specific, the phase adjusting section 88 previously obtains the phase difference by applying reference signals to the transformer 30 and the current transformer 40 and then sets the same delay time in the delay dircuit 34 during the course of the measurement. In the present embodiment, pulse signals corresponding to the phase error due to the transformer 30 and the current transformer 40 are transferred to the delay circuit 34.

Accordingly, in the delay circuit 34, the pulse width duty cycle signal transmitted from the pulse width modulation circuit 32 is delayed by a time corresponding to the phase error $\phi$. The pulse width duty cycle signal subjected to the phase error $\phi$ compensation is then multiplied by a voltage signal proportional to the current signal $e_i$ in the multiplying circuit 48. After a power signal obtained by the multiplication is signal-processed, an effective electric energy is displayed by the display circuit 68.

As seen from the foregoing description, in the second embodiment, the phase angle error $\phi$ produced when the load voltage and the load current on the power lines are respectively converted by the voltage transformer 30 and the current transformer 40 into the voltage and current signals $e_v$ and $e_i$, are corrected by the phase adjusting circuit 86 and the delay circuit 34, and then the time division multiplication of the signals as mentioned above is performed. Through the steps of signal processing, the electric energy is obtained. Therefore, according to the second embodiment, the effective electric energy can be measured with a high accuracy.

FIG. 13 shows in block form a third embodiment of an electronic electric-energy meter resulting with the teaching of the present invention is applied to a reactive electric-energy meter. In the figure, like symbols are used to designate like portions in the arrangement of the apparant electric-energy meter shown in FIG. 4, and a description of the operation of these portions will be omitted.

A difference between the reactive electric-energy meter shown in FIG. 13 and the apparent electric-energy meter of the first embodiment of FIG. 4 resides in the construction of the delay time setting circuit 42.

To obtain the effective power, the relation (the voltage signal $e_v$)×(the current signal $e_i$) is used, as mentioned above. From a simultaneous viewpoint, at time tl the effective power is the product of the current and voltage signals at points A and B as shown in FIGS. 14A and 14B respectively. To obtain the reactive power, calculation is made of the product of the current signal $e_i$ and a voltage signal $e_v'$ (FIG. 14C) which has been obtained by shifting the voltage signal $e_v$ phase by $\pi/2$. From an instantaneous standpoint, at time tl the reactive power results from the multiplication of the voltage signal by the current signal at points B and C. In the third embodiment, the reactive power is obtained as the product of the signals at points B and C' (FIG. 14A) in lieu of at points B and C by delaying the voltage signal $e_v$ by $\pi/2$.

The delay time setting circuit 42 comprises a delay time circuit 90. FIG. 15 schematically shows an arrangement of the delay time circuit 90. Like numerals in the figure designate like portions in FIG. 9 and no description of the portions will be given. One of the input terminals of each of the first and second comparators 82 and 84 is connected to the transformer 30. A reference signal terminal of the first comparator 82 is kept at a peak voltage. A reference signal terminal of the second comparator 84 is connected to ground and kept at zero potential. Output terminals of the first and second comparators are connected to the input terminal of a delay time setting section 90. The time delay setting section 90 obtains a phase difference of $\pi/2$ on the basis of the pulse signal representing a time point of the peak voltage transferred from the first comparator 82 and a time point of a zero potential delivered from the second comparator 84, and transfers pulse signals corresponding to the phase difference to the delay circuit 34.

Accordingly, in the delay circuit 34, the pulse width duty cycle signal delivered from the pulse width modulation circuit 32 is delayed by a time corresponding to the phase $\pi/2$. The pulse width duty cycle signal thus delayed $\pi/2$ is multiplied by the voltage signal proportional to the circuit signal $e_i$ in the multiplying circuit 48. The power signal obtained by the multiplication is subjected to the signal process, as mentioned above, and the electric energy is displayed through the display circuit 68.

As described above, in the third embodiment, the pulse width modulation is performed based on the voltage signal $e_v$ proportional to the load voltage on the power lines. After the pulse width duty cycle signal is digitally phase-shifted by $\pi/2$, it is multiplied by the load current $e_i$ on the power lines to obtain the reactive electric energy. Therefore, according to the third embodiment, the reactive electric energy can be measured with a high accuracy.

It is evident that the present invention is not limited to the first to third embodiments. In the first through third embodiments, the pulse width duty cycle signal is obtained on the basis of the voltage signal $e_v$ outputted from the voltage transformer 30 and is multiplied by the current signal $e_i$ outputted from the current transformer 40, thereby obtaining the electric power. Alternatively, the signal proportional to the electric power may be obtained in a manner that the pulse width duty cycle signal is obtained on the basis of the current signal and multiplied by the voltage signal.

While in the first through third embodiments, the random shift register 75 is used for the delay circuit section, a charge coupled device (CCD) or a bucket brigade device (BBD) may be used for the same purpose.

Having described specific embodiments of our bearing, it is believed obvious that modification and variation of our invention is possible in the light of the above teachings.

What is claimed is:

1. An electronic electric-energy meter for measuring a kind of electric energy carried on power lines, said meter comprising:

a. a voltage transformer connected to said power lines for producing a voltage signal proportional to a load voltage on said power lines;

b. a current transformer connected to said power lines for producing a current signal proportional to a load current on said power lines;

c. a pulse width modulation circuit connected to said voltage transformer for forming a pulse width duty cycle signal by performing a pulse width modulation based on said voltage signal;

d. delay circuit means connected to said pulse width modulation circuit for producing a delayed pulse width duty cycle signal by delaying said pulse width duty cycle signal by a delay time period specified in accordance with said kind of electric energy to be measured;

e. delay time setting circuit means connected to said delay circuit and at least one of said voltage transformer and said current transformer for setting said delay time period in said delay circuit;

f. a time division multiplying circuit connected through said delay circuit means to said pulse width modulation circuit and to said current transformer, which receives said delayed pulse width duty cycle signal and multiplies said current signal and said delayed pulse width duty cycle signal to obtain an electric power signal proportional to the electric power on said power lines corresponding to said kind of energy;

g. an integration circuit connected to said time division multiplying circuit for producing an electric energy signal proportional to said kind of electric energy by integrating said electric power signal;

h. a processing circuit connected to said integration circuit for converting said electric energy signal to a display signal; and i. a display circuit connected to said processing circuit for displaying a measure of said kind of electric energy in accordance with said display signal.

2. The electronic electric-energy meter according to claim 1, wherein said delay time setting circuit means comprises first and second pulse signal converting circuits connected respectively to said voltage transformer and said current transformer, said first and second pulse signal conversion circuits respectively detecting time points at which said voltage and current signals cross a zero level in the same direction and producing pulse signals corresponding to said time points, thereby to obtain the phase difference between said voltage and current signals in the form of a time difference by transferring said pulse signals individually as inputs to said delay circuit means for setting said delay time period.

3. The electronic electric-energy meter according to claim 1, wherein said delay time setting circuit means includes a phase adjusting circuit connected to said voltage transformer and said current transformer, said phase adjusting circuit detecting phase differences caused by said voltage transformer and said current transformer respectively in said voltage and said current signals by applying a reference voltage and a reference current with no phase difference therebetween to said voltage transformer and said current transformer respectively, thereby setting said delay time period in said delay circuit on the basis of time differences equal to said phase differences.

4. The electronic electric-energy meter according to claim 1, wherein said delay time setting circuit means includes a delay time circuit connected to said voltage transformer, said delay time circuit detecting time points at which said voltage signal from said voltage transformer reaches individually a zero level and a peak level, thereby setting said delay time period in said delay circuit on the basis of a time difference equal to a $\pi/2$ phase difference between said time points.

5. An electronic electric-energy meter for measuring a kind of electric energy carried on power lines, said meter comprising:

a. a voltage transformer connected to said power lines for producing a voltage signal proportional to a load voltage on said power lines;

b. a current transformer connected to said power lines for producing a current signal proportional to a load current on said power lines;

c. a pulse width modulation circuit connected to said current transformer for forming a pulse width duty cycle signal by performing a pulse width modulation based on said current signal;

d. delay circuit means connected to said pulse width modulation circuit for producing a delayed pulse width duty cycle signal by delaying said pulse width duty cycle signal by a delay time period specified in accordance with said kind of electric energy to be measured;

e. delay time setting circuit means connected to said delay circuit and at least one of said voltage transformer and said current transformer for setting said delay time period in said delay circuit;

f. a time division multiplying circuit connected through said delay circuit means to said pulse width modification circuit and to said voltage transformer, which receives said delayed pulse width duty cycle signal and multiplies said voltage signal and said delayed pulse width duty cycle signal to obtain an electric power signal proportional to the electric power on said power lines corresponding to said kind of energy;

g. an integration circuit connected to said time division multiplying circuit for producing an electric energy signal proportional to said kind of electric energy by integrating said electric power signal;

h. a processing circuit connected to said integration circuit for converting said electric energy signal to a display signal; and i. a display circuit connected to said processing circuit for displaying a measure of said kind of electric energy in accordance with said display signal.

6. The electronic electric-energy meter according to claim 5, wherein said delay time setting circuit means comprises first and second pulse signal converting circuits connected respectively to said voltage transformer and said current transformer, said first and second pulse signal conversion circuits respectively detecting time points at which said voltage and current signals cross a zero level in the same direction and producing pulse signals corresponding to said time points, thereby to obtain the phase difference between said voltage and current signals in the form of a time difference by transferring said pulse signals individually as inputs to said delay circuit means for setting said delay time period.

7. The electronic electric-energy meter according to claim 5, wherein said delay time setting circuit means includes a phase adjusting circuit connected to said voltage transformer and said current transformer, said phase adjusting circuit detecting phase differences caused by said voltage transformer and said current transformer respectively in said voltage and said current signals by applying a reference voltage and a reference current with no phase difference therebetween to said voltage transformer and said current transformer, thereby setting said delay time period in said delay circuit on the basis of time differences equal to said phase differences.

8. The electronic electric-energy meter according to claim 5, wherein said delay time setting circuit means includes a delay time circuit connected to said current transformer said delay time circuit detecting time points at which said current signal from said current transformer reaches individually a zero and a peak level, thereby settting said delay time period in said delay circuit on the basis of a time difference equal to a $\pi/2$ phase difference between said time points.

* * * * *

UNITED STATES PATENT AND TRADEMARK OFFICE
CERTIFICATE OF CORRECTION

PATENT NO. : 4,463,311

DATED : July 31, 1984

INVENTOR(S) : Shunichi Kobayashi

It is certified that error appears in the above—identified patent and that said Letters Patent is hereby corrected as shown below:

Claim 5, Col. 2, line 19, "modification" should be -- modulation --; and

Claim 8, Col. 2, line 64, after "zero" insert -- level --.

Signed and Sealed this

Fifth Day of March 1985

[SEAL]

Attest:

DONALD J. QUIGG

Attesting Officer     Acting Commissioner of Patents and Trademarks